United States Patent [19]

Lo et al.

[11] Patent Number: 4,692,899
[45] Date of Patent: Sep. 8, 1987

[54] PROPAGATIONAL CONTROL FOR VERTICAL BLOCH LINE MEMORIES

[75] Inventors: David S. Lo, Burnsville; Stanley J. Lins, Bloomington, both of Minn.

[73] Assignee: Sperry Corporation, Blue Bell, Pa.

[21] Appl. No.: 808,200

[22] Filed: Dec. 12, 1985

[51] Int. Cl.$^4$ ............................................ G11C 19/08
[52] U.S. Cl. ........................................ 365/29; 365/87
[58] Field of Search ............................ 365/29, 87, 39

[56] References Cited

U.S. PATENT DOCUMENTS

| | | | |
|---|---|---|---|
| 4,095,279 | 6/1978 | Lins | 365/29 |
| 4,101,972 | 7/1978 | Lins et al. | 365/29 |
| 4,122,538 | 10/1978 | Lins | 365/29 |
| 4,583,200 | 4/1986 | Konishi et al. | 365/29 |

OTHER PUBLICATIONS

S. Konishi, A New Ultra-High-Density Solid State Memory; Block Line Memory, IEEE Transactions on Magnetics, vol., Mag. 19, No. 5, Sep. 1983, pp. 1838–1840.
Hidaka, Matsuyama, et al., Experimental Confimation of Fundamental Functions for a Novel Bloch Line Memory, IEEE Transactions on Magnetics, vol. Mag 29, #5, 9–83, pp. 1841–1843.
Hidaka, et al., Bloch Line Stabilization in Stripe Domain Wall for Bloch Line Memory, IEEE Transactions on Magnetics, vol. Mag. 20, No. 1, Sep. 1984, pp. 1135–1137.
Klein, et al., Bloch Line Memory: Dams for Stripe Domain Confinement, J. Appl. Phy., vol. 57, No. 1, Apr. 15, 1985, pp. 4071–4073.
Humphrey & Wu, Vertical Bloch Line Memory, presented at 1985 Intermag Conference in St. Paul.
Maffitt, et al., Electron Mirror Microscopy of Stripe Domains, The Review of Scientific Instruments, vol. 39, No. 2, 259, Feb. 1968.
M. R. Lian and F. B. Humphrey, Observation of Vertical Bloch Line Propagation, Journal of Applied Physics, vol. 57, Apr. 15, 1987, pp. 4065–4067.
J. C. Wu and F. B. Humphrey, Bloch Lines Generataion in Moving Stripe Heads, Journal of Applied Physics, vol. 57, Apr. 15, 1985, pp. 4068–4070.
G. Ronan and S. Konishi, A Three-Dimensional Computer Simulation of a Translating Magnetic Bubble, Journal of Applied Physics, vol. 57, Apr. 15, 1985, pp. 4074–4076.
David S. Lo, Magnetic Properties of Ni–Fe Films Coupled with Stripe-Domain Films, IEEE Translations on Magnetics, vol. Mag-4, No. 4, Dec. 1968, pp. 7-21-722.
Koikeda, et al., Electron–Microscopic Observation of "Stripe" or Dense-Banded Magnetic Domains in Nickel-Rich Permalloy Films, Applied Physics Letters, vol. 4, #9, 5–64, pp. 160–163.
Tatsumoto, et al., A New Type of Stripe Domains, Japan J. Appl. Phys. 7 (1968), 176.
Eschenfelder, Magnetic Bubble Technology, Singer-Verlag Berlin Heidelberg, NY, 1980.
Abstract No. 2Pa7 Stripe Domain Stabilization for Bloch Memory, International Conference on Magnetism, 1985.
Tatsumoto, et al., Anomalous Anisotropy in 76 Permalloy Films Evaporated at Oblique Incidence, Faculty of Science, Hiroshima University, Hiroshima, pp. A-3.-1-A-3.2.
Lo & Hanson, Magetic Properties and Creep Observations of Ni–Fe Films 30 to 300 A Thick, IEEE Transactions on Magnetics, vol. Mag-5, No. 2 Jun. 1969, pp. 115–118.
Rye Brook, Superdense Memory Devices are Evolving from Bubbles, NEWS, Oct. 14, 1985, pp. 16–17.
Lo & Hanson, Origin of Strpie Domains in Ni–Fe Films, Journal of Applied Physics, vol. 38, No. 3, 1342–1343, Mar. 1 1967.

Primary Examiner—James W. Moffitt
Attorney, Agent, or Firm—Glenn W. Bowen; Laurence J. Marhoefer

[57] ABSTRACT

Stabilization of the propagation of storage bits around the storage loops of a Vertical Bloch Line (VBL) memory is obtained by the vapor-deposition of a nickel-iron film over the VBL structure. The film has a composition range of 65–90% nickel and a thickness of 1,000 to 10,000 Angstroms, and is deposited in a vacuum of $10^{-4}$ to $10^{-6}$ Torr to provide parallel, periodic, magnetic stripe domains, and thus potential well domains, that have a periodicity in the range of 0.1 to 1 micron. The stripe domains are oriented perpendicular to the direction of data propagation and form potential wells along the elongated direction of the storage loops.

4 Claims, 1 Drawing Figure

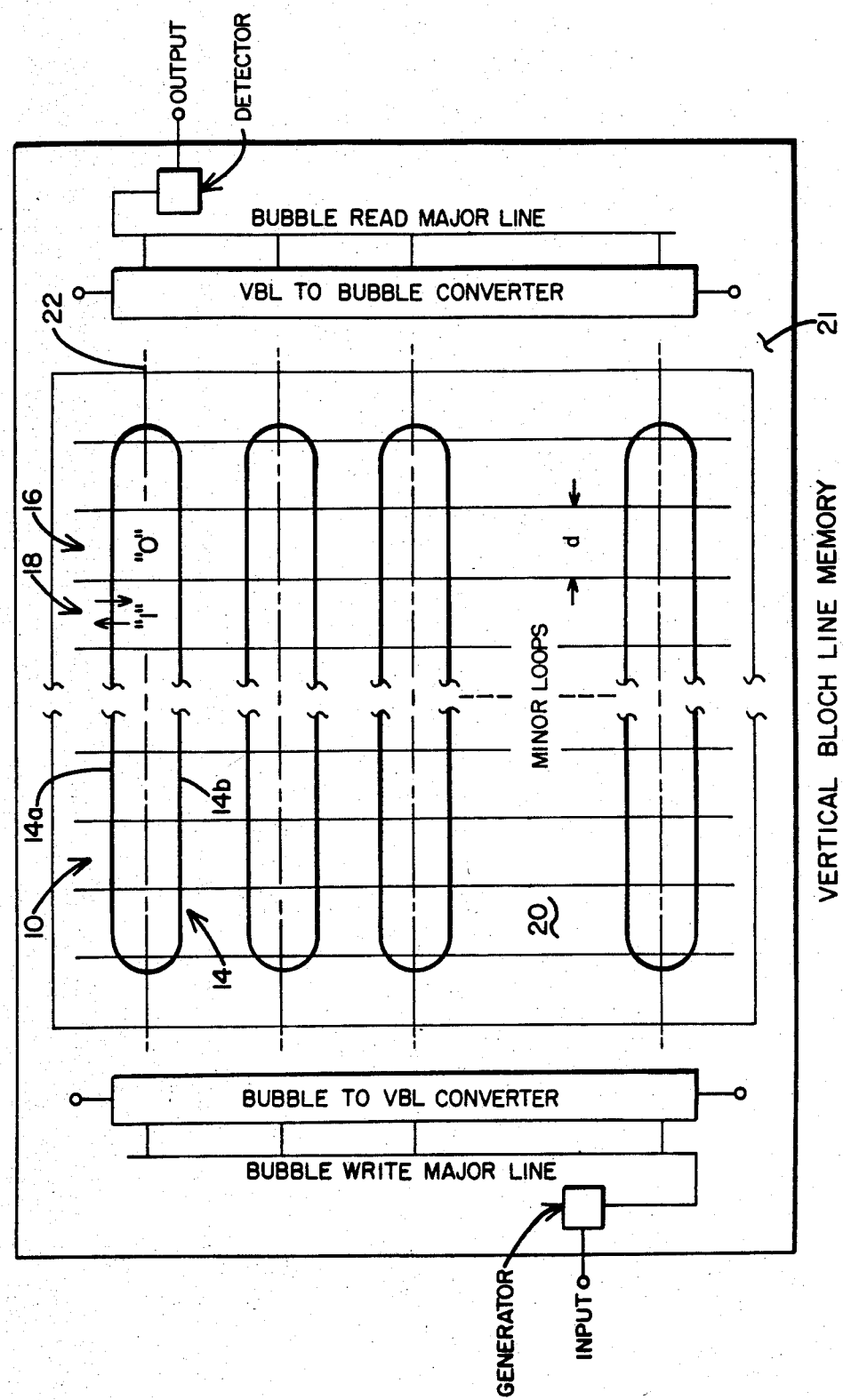

PROPAGATIONAL CONTROL FOR VERTICAL BLOCH LINE MEMORIES

BACKGROUND OF THE INVENTION

The present invention is related to Vertical Bloch Line memories, and in particular, to a polycrystalline, magnetic thin film producing potential well for propagation control for such memories.

Vertical Bloch Line memories have been proposed in "A New Ultra-High Density Solid State Memory: Bloch Line Memory" by Susumu Konishi, *IEEE Transactions on Magnetics*, Vol. MAG 19, NO. 5, P. 1838, September 1983 and in "Experimental Confirmation of Fundamental Functions for a Novel Bloch Line Memory" by Y. Hidaka, K. Matsuyama and S. Konishi, *IEEE Transaction on Magnetics*, Vol. MAG-19, NO. 5, P. 1841, September 1983. The described memories of these articles rely on the propagation of Vertical Bloch Lines (VBL) along the domain walls in garnet films (i.e. by circulating in an elongated data storage loop.). In these memories, VBL propagation around a loop of an elongated domain wall is obtained by successively applied pulsed bias fields.

Magnetic bubbles are thus employed in the input major lines in the same manner as in conventional bubble memory devices. Transfer gates are utilized to transform data, written as magnetic bubbles in an input major line, into VBL pairs in the minor storage loops. Data stored by VBL pairs is also transformed from the minor loops back into magnetic bubbles in an output major line. Writing into the minor loops may be done either directly by applying fields to inject the VBL pairs into a wall, or by converting a bubble from the input major line into a VBL pair in a wall. When reading a VBL pair from a wall, a VBL pair may be converted back to a bubble by applying pulsed magnetic fields, and detection of the bubble may then be achieved by conventional magneto-resistive techniques.

An anticipated advantage of the proposed VBL memory is a great increase in the bit density of approximately 100 times as high as the bit density of a conventional bubble device. This may be achieved since the estimated Bloch Line pair size is from 0.1 to 1 micron for garnet material that provides bubble sizes of 0.5 to 5 microns, respectively. Thus, it may be possible to achieve storage densities comparable to those of magneto-optical disc or magnetic recording techniques.

The VBL memory is organized as disclosed in the article entitled "A New Ultra-High-Density Solid State Memory: Bloch Line Memory." A read-write control represents a bubble memory major line in which a generator generates the bubble memory data and a detector detects the presence or absence of the bubbles that represent the data bits. The control gate functions when bubble is present to provide a VBL pair to represent a "1" in the presence of a bubble, at one segment of the elongated domain wall. An "0" bit or the absence of a bubble in the read-write bubble major line results in no VBL pair in the associated moving segment of the elongated data storage loop. The elongated domain walls of all of the storage loops are divided into a large number of moving segments, which may or may not contain VBL pairs in accordance with whether or not a logical "1" or a logical "0" bit of information is stored in that segment.

The transformation of bubbles through the control gates into VBL pairs in the storage loops and VBL pairs in the storage loops back into bubbles in the major line occurs in read-write conductors. Propagation of the VBL pairs around the storage loops occurs so that reading may occur at the read-write conductors obtained under the control of a pulsed biased driver as disclosed by Konishi in the article "A New Ultra-High-Density Solid State Memory: Bloch Line Memory".

Desirably the data containing segments of the elongated domain walls utilize some form of a potential well so that the bits of the storage loops will contain substantially equal size segments so they will arrive at the read-write conductor, or other read-write device at the proper location. Konishi, in the above-noted article of this paragraph, suggested the use of a grating pattern for this purpose. However, the use of a physical grating pattern for this type of memory greatly restricts the bit density of such a memory since Vertical Bloch Line periodicity of 0.2 micron, or smaller, may be achieved and physical grating sizes in this range are extremely difficult to implement.

A necessity of providing spatially periodic variations along the elongated stripe domain wall of a Vertical Bloch Line memory in order to obtain the necessary potential wells for VBL generation is disclosed in the article entitled "Bloch Line Stabilization in Stripe Domain Wall for Bloch Line Memory" published in *IEEE Transactions on Magnetics*, Vol. Mag-20, No. 5, P. 1135, September 1984 by Y. Hidaka and H. Matsutera. In this article three different types of techniques were investigated to provide the potential wells. These involved ion implantation to the domain wall supporting layer, a chrome pattern producing a large internal negative stress, and narrow Permalloy nickel-iron film strips. These were fabricated with a strip width of 1.2 microns and with a periodicity along the length of the strip of either 2.4 microns or 10 microns. It was a conclusion of the authors of this article that the VBL trapping mechanism for a chrome pattern was thought to be the same as that for a pattern made by ion implantation. However, the magneto-static effect of a Permalloy strip pattern, as described above, was found not to be applicable to control the VBL propagation along the stripe domain wall when the VBL was propagated by using gyrotropic force.

The assignee of the present invention has obtained U.S. Pat. Nos. 4,095,279; 4,101,972; and 4,122,538 as a result of previous bubble memory work. These patents disclose bubble memories which are formed on a garnet substrate and which have stripe domain layers formed thereon to provide a set of relatively narrow, periodic, potential wells. For example by reference to FIG. 2 of U.S. Pat. No. 4,095,279, it is seen that a Gadolinium Gallium Garnet (GGG) substrate is provided with a stripe domain layer 16 of a magnetic material of 3 to 10 microns in thickness. A nonmagnetic garnet spacer layer 20 of GGG of 0.5 to 10 microns in thickness is formed on the stripe domain layer 16. A bubble domain 22 of a magnetic material of 3 to 10 microns in thickness in which a plurality of bubble domains 24 are generated, sustained and moved about lies on the spacer layer 20.

Channels are formed for the domains by ion-milling, ion-implantation or by relatively wide fixed stripe domains, such as domains 38 of FIG. 3. While the relatively-narrow stripe domains that are provided by the stripe domain layer 16 of the above-noted patents of the assignee of this invention are capable of providing potential wells and of being formed on garnet substrates, use of these concepts for VBL memory device can unduly complicate the fabrication of a VBL memory device since the layer 16 is formed as a single crystalline layer. For manufacturing purposes, the VBL memory may be constructed without the imposition of a separate single crystalline layer, in the manner described in the aforementioned patents. At the present time, however, for the VBL memory device only the ion implantation and chrome pattern techniques of the Hidaka and Matsutera article have been proposed as possible successful solutions, and even with these the period of 2.4 microns is much greater than is desirable. For example in the operation of such a VBL memory, it would be desirable to reduce this period of 2.4 microns by an order of magnitude.

Another article entitled "Bloch Line Memory: Dams for Stripe Domain Confinement" *J. Appl. Phy.* Vol. 57, No. 1, P. 4071, April 1985 was written by K. Klein and J. Engemann. This article suggested the use of ion-milled grooves and dams for providing potential wells for domain wall confinement of VBL memories. An article describing Vertical Bloch Lines as a mechanism of chirality, change or "twist" of magnetization in bubble garnet materials entitled "Vertical Bloch Line Memory" by F. B. Humphrey and J. C. Wu was published in *IEEE Transactions On Magnetics*, Vol. MAG-21, NO. 5, September 1985, P. 1762. This article described the general requirements of VBL memories and experimental work, and mentioned the necessity of providing equilibrium, or cell, position along the elongated domain wall so that a "0" could be propagated with as much certainty as a "1".

A co-inventor of the present invention in conjunction with A. L. Olson, E. J. Torok and K. N. Maffitt in an article entitled "Electron Mirror Microscopy of Stripe Domains" in *The Review of Scientific Instruments* Vol. 39, No. 2, 259 February 1968, described the results of an investigation in which they were able to obtain parallel magnetic stripe domains in Permalloy films. These stripes had a periodicity of approximately 1 micron. The stripe domains appeared only when the film was thicker than a certain critical thickness, which in turn depended upon film composition, type of substrate, substrate temperature, deposition rate, and other process conditions. The critical minimum thickness for the described film is about 1000 Å (Angstroms). The film was a 90% nickel and 10% iron film of 10,000 Å thickness. The film was vapor-deposited at 20 Å per second onto a microslide that was held at 250° C. in a vacuum of $10^{-6}$ Torr. The resulting stripe domains were viewed by an electron mirror microscope.

An article describing stripe domains formed in nickel-iron films was described also in "Origin of Stripe Domains in Ni-Fe Films" by a co-inventor of the present application and M. M. Hanson in the *Journal of Applied Physics*, Vol. 38, No 3, 1342–1343 Mar. 1, 1967. This article notes that films which are deposited in a "poor" vacuum, on the order of $10^{-4}$ Torr, are suitable for formation of stripe domains. It was proposed in this article that shape anisotropy, especially in the neighborhood of a composition of approximately 81.7% Ni, is a dominant factor in determining stripe domains. It was also indicated in this article that stripe domains were found in nickel-iron films with the range of 65–90% nickel for thicknesses ranging from approximately 3,500 Å at 65% nickel to approximately 1,000 Å at 90% nickel.

Additional articles dealing with stripe domain films include one entitled "Magnetic Properties of NiFe Films Coupled With Stripe-Domain Films", which was printed in *IEEE Transactions on Magnetics*, Vol. MAG-4, No. 4, P. 721, December 1968 by David S. Lo, a co-inventor of the present invention. The stripe domain films of this article were 81.7% nickel and 18.3% iron and were separated by a silicon oxide layer from an ordinary nickel-iron film in order to study the change in anisotropy field, coercivity, angular dispersion and the creep threshold of an ordinary nickel film. The stripe domain films were vapor deposited in the presence of an orienting field of 85 Oersteds at approximately 30 Angstroms per second in a $10^{-5}$ Torr vacuum. The stripe domain films were approximately 3400 Angstroms thick.

Other articles discussing stripe domain nickel-iron films have been published including "Electron-Microscopic Observation of 'Stripe' or 'Dense-Banded' Magnetic Domains in Nickel-Rich Permalloy Films", which appeared in *Applied Physics Letter*, Vol. 4, No. 9, P. 160, May 1, 1964 and authored by Tosiaki Koikeda, et al. The films described in this article were 95% nickel and 5% iron films which were evaporated onto a substrate at 100° C. in order to prevent epitaxial growth of a single crystal film. The duration of the evaporation was 180 seconds and the thickness of the film was 1200 Angstroms. The vacuum was $8 \times 10^{-5}$ Torr during evaporation to obtain a rotatable anisotropy. Another article that appeared in the Japanese *Journal of Applied Physics*, Vol. 7 (1968) P. 176, was entitled "A New Type of Stripe Domains" and was authored by Eiji Tatsumoto, et al. This article described a film of 76% nickel and 24% iron with a thickness of more than 2000 Angstroms that was evaporated at an oblique incidence angle of 45° on a glass substrate heated at 200° C. in a vacuum on the order of $10^{-5}$ Torr.

The present invention makes use of stripe domains, such as those taught in the above-noted articles, to provide potential well patterns of a smaller periodicity than has previously been obtainable for VBL memories.

SUMMARY OF THE INVENTION

The present invention employs the use of parallel magnetic stripe domains, with a periodicity on the order of 1 micron, or less, which are positioned over the elongated storage walls of Vertical Bloch Line memory. The parallel stripe domains are provided by vapor-deposition of nickel-iron films on the magnetic garnet. The stripe domains provide potential wells for a precise stabilization of the bit positions of the VBL pairs as they propagate.

BRIEF DESCRIPTION OF THE DRAWINGS

The present invention is described by reference to the drawing which is a block diagram of a memory that utilizes Vertical Bloch Line propagation in elongated magnetic storage loops in which stabilization of the VBL line memory pairs is obtained by the deposition of nickel iron films over the elongated storage loops.

DESCRIPTION OF THE INVENTION

The present invention is described by reference to the FIGURE in which the elongated storage loops provide the minor loops of a Vertical Bloch Line memory 10. It should be noted the FIGURE represents a schematic showing of the storage loops and of the depicted VBL's and is not drawn to scale. Each of the elongated storage loops are formed by two elongated, closely-spaced walls aligned in parallel that extend between the bubble-to-VBL converter and the VBL-to-bubble converter. The ratio of the major axis to the minor axis of these elliptical domains is large, at least 10 to 1 and may be 100 to 1, or more. The VBL's are formed as twists in an elongated wall of bubble materials. Information can be written into predefined segments via the write major line to store binary bits, such as the "0" and "1" bits that are stored in segments 16, 18 respectively, of the storage loop 14.

The presence of two arrows in a segment, such as a segment 18, indicates a Vertical Bloch Line pair and the presence of a "1" bit in that position. The absence of a Vertical Bloch pair in the segment 16 indicates this is "0" storage bit. A pulsed bias driver serves to propagate the VBL pairs around the elongated storage loop 14 formed of the two elongated parallel walls 14a and 14b. Read-out may be obtained by means of conventional magneto-resistive read-out circuitry.

In order to confine the information-bearing segments to precise locations so that they do not arrive too soon or too late at the read major line, vapor-deposited nickel-iron films with preferred thickness on the order of 1,000 to 10,000 Å, are vapor-deposited on an insulating layer 20 formed on the garnet substrate 21. The nickel-iron films preferably have a composition of approximately 65% to 95% nickel, and are deposited in vacuums which preferably range from $10^{-4}$ to $10^{-6}$ Torr. The vapor-deposition may be obtained at a rate on the order of 20 Å per second, with the substrate held at approximately 200°-250° C.

Films deposited in this manner will have periodic stripe domains with a width dimension "d" as shown in the FIGURE on the order of 1 micron or less. The stripe domains are oriented perpendicular to the elongated dimension 22 of the storage loop 14. The parallel stripe domains of these thin films provide the desired stray magnetic field with an appropriate periodicity in the direction parallel to the elongated dimension 22 of the storage, loop to produce potential which provide an improved Vertical Bloch Line memory structure.

What is claimed is:

1. In a Vertical Bloch Line pair memory comprising at least one elongated storage loop, means for writing Vertical Bloch Line pair storage bits into each of said storage loops, means for propagating said Vertical Bloch Line pair storage bits around each of said storage paths, and means for detecting said Vertical Bloch Line pair storage bits, the improvement comprising a deposited stripe domain magnetic film over said storage loops, and the stripe domain provides contiguous, spatially periodic, parallel, magnetic potential wells, each which have a periodicity in the range of 0.1 to 1 micron wide in the direction along the elongated direction of said storage loops.

2. In a Vertical Bloch Line pair memory as claimed in claim 1, the improvement wherein said deposited film is a nickel-iron film having a composition range of 65-90% nickel, and a thickness of 1,000 to 10,000 Angstroms which is vapor-deposited in a vacuum of $10^{-4}$ to $10^{-6}$ Torr, wherein said parallel, spatially periodic, magnetic potential wells have a periodicity in the range 0.1 to 1 micron in the direction along the elongated direction of said storage loops.

3. The use of nickel-iron films having a composition range of approximately 65-90% nickel, and a thickness of 1,000 to 10,000 Angstroms which are vapor-deposited over the storage paths of a Vertical Bloch Line memory which have an elongated dimension and which films are deposited in a vacuum of $10^{-4}$ to $10^{-6}$ Torr to provide parallel, spatially periodic, magnetic potential wells that have a periodicity in the range of 0.1 to 1 micron in the direction parallel to the elongated dimension of said storage paths.

4. The use of nickel-iron films of claim 3 wherein said storage paths are storage loops having an elongated shape and said potential wells exhibit a periodicity along the elongated direction of said storage loops.

* * * * *